(12) United States Patent
Chang

(10) Patent No.: US 11,308,996 B2
(45) Date of Patent: Apr. 19, 2022

(54) SENSING CIRCUIT AND METHOD FOR MULTI-LEVEL MEMORY CELL

(71) Applicant: eMemory Technology Inc., Hsin-Chu (TW)

(72) Inventor: Che-Wei Chang, Hsinchu County (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 17/241,112

(22) Filed: Apr. 27, 2021

(65) Prior Publication Data

US 2022/0020402 A1 Jan. 20, 2022

Related U.S. Application Data

(60) Provisional application No. 63/051,879, filed on Jul. 14, 2020.

(51) Int. Cl.
*G11C 7/00* (2006.01)
*G11C 7/06* (2006.01)
*G11C 7/22* (2006.01)
*G11C 7/10* (2006.01)

(52) U.S. Cl.
CPC .............. *G11C 7/065* (2013.01); *G11C 7/106* (2013.01); *G11C 7/1087* (2013.01); *G11C 7/222* (2013.01)

(58) Field of Classification Search
CPC ........................................................ G11C 7/106
USPC ....................................................... 365/189.05
See application file for complete search history.

(56) References Cited

U.S. PATENT DOCUMENTS

| 6,169,503 | B1 * | 1/2001 | Wong ..................... | H03M 1/361 |
| | | | | 341/136 |
| 7,701,776 | B2 | 4/2010 | Gallo et al. | |
| 2015/0340092 | A1 * | 11/2015 | Ogasahara ............. | G11C 29/06 |
| | | | | 711/105 |

\* cited by examiner

*Primary Examiner* — Hoai V Ho
(74) *Attorney, Agent, or Firm* — WPAT, PC

(57) ABSTRACT

A sensing circuit includes a cell clock generator, a reference clock generator, a counter, a latching signal generator, a latch and a count-to-state conversion circuit. The cell clock generator receives a cell current from a selected memory cell, and converts the cell current into a cell clock signal. The reference clock generator converts a reference current into a reference clock signal. The count receives the cell clock signal, and generates a count value. When a pulse number of the reference clock signal reaches a predetermined count value, the latching signal generator activates a latching signal. When the latching signal is activated, the latch issues a latched count value. The count-to-state conversion circuit receives the latched count value, and issues a state value. A storage state of the selected memory cell is determined according to the state value.

15 Claims, 5 Drawing Sheets

| Icell | $CNT_L$ | State |
|---|---|---|
| Icell<1μA | 0 | 11 |
| 1μA<Icell<2μA | 1 | |
| 2μA<Icell<3μA | 2 | 10 |
| 3μA<Icell<4μA | 3 | |
| 4μA<Icell<5μA | 4 | |
| 5μA<Icell<6μA | 5 | 01 |
| 6μA<Icell<7μA | 6 | |
| 7μA<Icell<8μA | 7 | |
| 8μA<Icell<9μA | 8 | 00 |
| 9μA<Icell<10μA | 9 | |
| 10μA<Icell<11μA | 10 | |
| 11μA<Icell | 11~ | |

US 11,308,996 B2

SENSING CIRCUIT AND METHOD FOR MULTI-LEVEL MEMORY CELL

This application claims the benefit of U.S. provisional application Ser. No. 63/051,879, filed Jul. 14, 2020, the subject matter of which is incorporated herein by reference.

FIELD OF THE INVENTION

The present invention relates to a sensing circuit and a sensing method, and more particularly to a sensing circuit and a sensing method for a multi-level memory cell.

BACKGROUND OF THE INVENTION

As is well known, a non-volatile memory is able to continuously retain data after the supplied power is interrupted. After the non-volatile memory leaves the factory, the user can program the memory cells of the non-volatile memory. Consequently, the data can be recorded into the memory cells of the non-volatile memory.

For increasing the storage density and reducing the chip area, a non-volatile memory with multi-level memory cells has been introduced into the market. The multi-level memory cell is able to store a data with at least two bits. For example, if the multi-level memory cell is able to store a 2-bit data, the multi-level memory cell has four storage states. Similarly, if the multi-level memory cell is able to store a 3-bit data, the multi-level memory cell has eight storage states. Similarly, if the multi-level memory cell is able to store a 4-bit data, the multi-level memory cell has sixteen storage states.

While a read action of the multi-level memory cell is performed, a sensing circuit receives a cell current from the multi-level memory cell and determines the storage state of the multi-level memory cell according to the magnitude of the cell current. For example, if the multi-level memory cell is able to store the 2-bit data, the magnitudes of the generated cell currents corresponding to the four storage states are different. For example, the generated cell current corresponding to the storage state "00" is 10 µA, the generated cell current corresponding to the storage state "01" is 7 µA, the generated cell current corresponding to the storage state "10" is 3 µA, and the generated cell current corresponding to the storage state "11" is 0.5 µA.

FIG. 1A is a schematic circuit diagram illustrating a sensing circuit for a multi-level memory cell according to prior art. FIG. 1B is a schematic timing waveform diagram illustrating associated signals of the sensing circuit during the read action. For example, the multi-level memory cell 100 is able to store the 3-bit data. The multi-level memory cell 100 is connected between a bit line BL and a ground terminal GND.

A pre-charge circuit is connected between a supply voltage Vdd and a sensing node s. The pre-charging circuit comprises a NOT gate 120 and a transistor M1. The input terminal of the NOT gate 120 receives a pre-charge signal PreC. The output terminal of the NOT gate 120 is connected with the gate terminal of the transistor M1. The first drain/source terminal of the transistor M1 receives the supply voltage Vdd. The second drain/source terminal of M1 is connected with the sensing node s.

A switching circuit is connected between the bit line BL and the sensing node s. The switching circuit comprises a controller 110 and a transistor M2. The controller 110 generates a switching signal SW. The gate terminal of the transistor M2 receives the switching signal SW. The first drain/source terminal of the transistor M2 is connected with the sensing node s. The second drain/source terminal of the transistor M2 is connected with the bit line BL.

The sensing circuit 150 comprises plural resistors R1~R7, plural comparators 151~157 and an 8-line to 3-line encoder 159. The plural resistors R1~R7 are connected between a node a and the ground terminal GND. Moreover, a voltage divider circuit is defined by the plural resistors R1~R7. The node a receives a reference voltage Vref. By the voltage divider circuit, the voltage divider circuit generates plural divided voltages from the node a to the node g. The positive input terminals of the comparators 151~157 are connected with the sensing node s to receive a sensing voltage Vsense. The negative input terminals of the comparators 151~157 are respectively connected with the corresponding nodes a, b, c, d, e, f and g to receive the corresponding divided voltages. The output terminals of the comparators 151~157 are connected with the 8-line to 3-line encoder 159. The output terminal of the 8-line to 3-line encoder 159 generates a 3-bit binary code d2~d0.

In FIG. 1B, the waveforms of the associated signals during the read action are shown. Before the time point t0, the controller 110 activates the switching signal SW to turn on the transistor M2. Meanwhile, the bit line BL is connected with the sensing node s, and the multi-level memory cell 100 is a selected memory cell.

The time interval between the time point t0 and the time point t1 is a pre-charge phase. In the pre-charge phase, the pre-charge signal PreC is activated. Consequently, the transistor M1 is turned on, the sensing voltage Vsense at the sensing node s is pre-charged to the supply voltage Vdd.

At the time point t1, a discharge period starts. The sensing voltage Vsense at the sensing node s is gradually decreased from the supply voltage Vdd. Generally, the drop rate of the sensing voltage Vsense is in proportion to the magnitude of the cell current Icell. In case that the magnitude of the generated cell current Icell is higher, the drop rate of the sensing voltage Vsense is faster. Whereas, in case that the magnitude of the generated cell current Icell is lower, the drop rate of the sensing voltage Vsense is slower.

At the time point t2, the discharge period ends. According to the sensing voltage Vsense, the storage state of the multi-level memory cell 100 is determined by the sensing circuit 150.

For example, if the sensing voltage Vsense is higher than the reference voltage Vref at the time point t2, the comparators 151~157 of the sensing circuit 150 are all enabled. Consequently, the 3-bit binary code d2~d0 generated by the 8-line to 3-line encoder 159 is "111". The 3-bit binary code indicates that the storage state of the multi-level memory cell 100 is "111".

If the comparator 151 is disabled but the other comparator 152~157 are enabled at the time point t2, the 3-bit binary code d2~d0 generated by the 8-line to 3-line encoder 159 is "110". The 3-bit binary code indicates that the storage state of the multi-level memory cell 100 is "110". The rest may be deduced by analog. In other words, the 8-line to 3-line encoder 159 is "110 of the sensing circuit 150 determines the storage state of the multi-level memory cell 100 according to the number of the enabled comparators of the comparators 151~157.

However, since the sensing circuit 150 as shown in FIG. 1A comprises many comparators 151~157, the chip area is large. In addition, since the voltage division circuit of the sensing circuit 150 comprises many resistors R1~R7, the DC power consumption of the sensing circuit 150 is high.

SUMMARY OF THE INVENTION

The present invention provides a sensing circuit with a novel circuitry structure for judging the storage state of a multi-level memory cell.

An embodiment of the present invention provides a sensing circuit. The sensing circuit is connected with a selected memory cell. The sensing circuit includes a cell clock generator, a reference clock generator, a counter, a latching signal generator, a latch and a count-to-state conversion circuit. The cell clock generator receives a cell current from the selected memory cell, and converts the cell current into a cell clock signal. The selected memory cell is a multi-level memory cell. The reference clock generator receives a reference current, and converts the reference current into a reference clock signal. The count receives the cell clock signal, and generates a count value. The latching signal generator receiving the reference clock signal. When a pulse number of the reference clock signal reaches a predetermined count value, the latching signal generator activates a latching signal. The latch receives the count value and the latching signal. When the latching signal is activated, the latch issues a latched count value. The count-to-state conversion circuit receives the latched count value, and issues a state value. A storage state of the selected memory cell is determined according to the state value.

Another embodiment of the present invention provides a sensing method for a non-volatile memory. The sensing method includes the following steps. Firstly, a cell current is received from a selected memory cell of the non-volatile memory, and the cell current is converted into a cell clock signal. The selected memory cell is a multi-level memory cell. Then, a reference current is received, and the reference current is converted into a reference clock signal. Then, a first pulse number of the cell clock signal and a second pulse number of the reference clock signal are continuously counted. When the second pulse number reaches a predetermined count value, the first pulse number is latched. Then, a storage state of the selected memory cell is determined according to the latched first pulse number.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
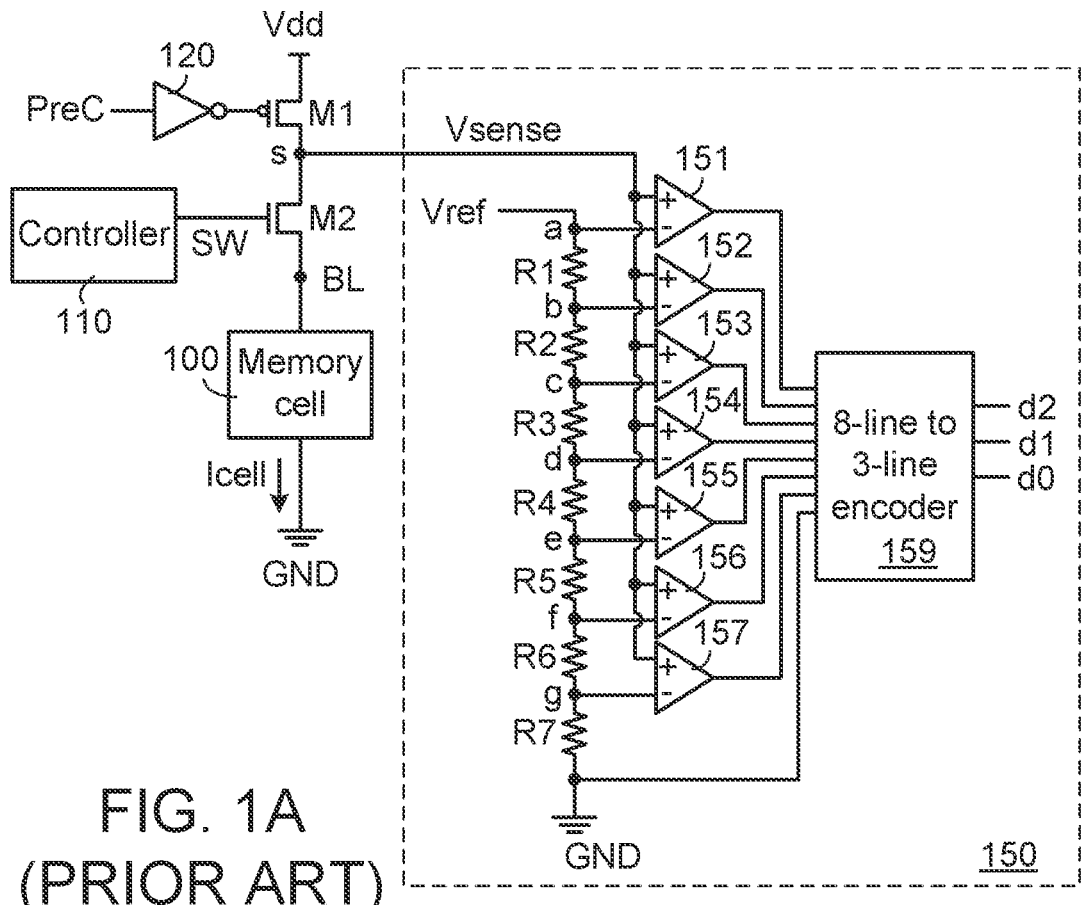
FIG. 1A (prior art) is a schematic circuit diagram illustrating a sensing circuit for a multi-level memory cell according to prior art.
Figure 1B:
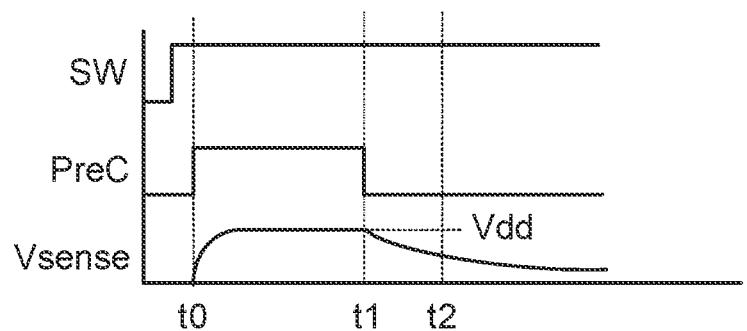
FIG. 1B (prior art) is a schematic timing waveform diagram illustrating associated signals of the sensing circuit during the read action.
Figures 2A, 2B:
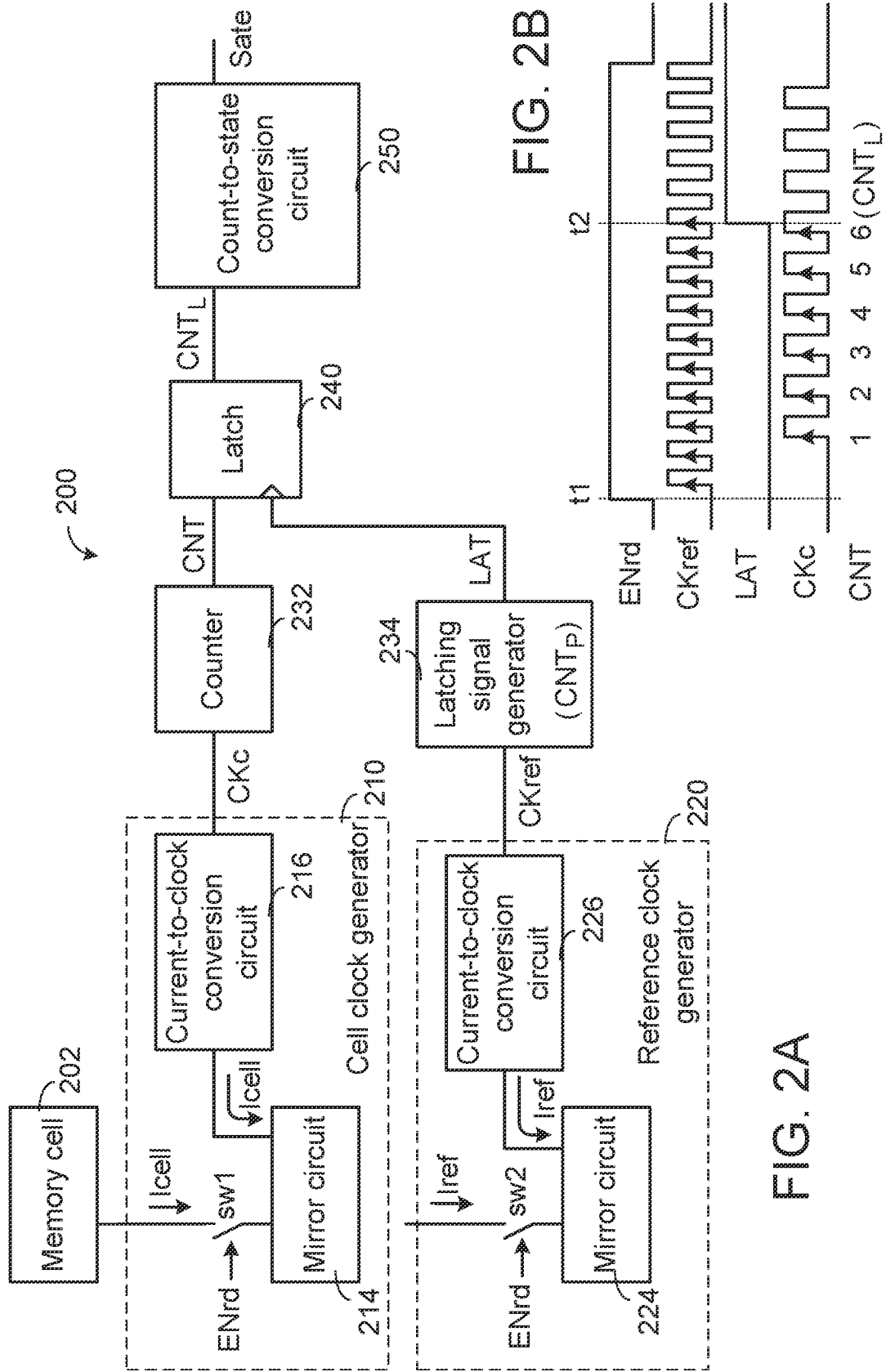
FIG. 2A is a schematic circuit diagram illustrating a sensing circuit for a multi-level memory cell according to an embodiment of the present invention.
FIG. 2B is a schematic timing waveform diagram illustrating associated signals of the sensing circuit during the read action.

FIG. 2A is a schematic circuit diagram illustrating a sensing circuit for a multi-level memory cell according to an embodiment of the present invention. FIG. 2B is a schematic timing waveform diagram illustrating associated signals of the sensing circuit during the read action. For example, the multi-level memory cell 202 is able to store the 2-bit data.

The sensing circuit 200 comprises a cell clock generator 210, a reference clock generator 220, a counter 232, a latching signal generator 234, a latch 240 and a count-to-state conversion circuit 250.

The input terminal of the cell clock generator 210 is connected with the multi-level memory cell 202. The output terminal of the cell clock generator 210 generates a cell clock signal CKc. The cell clock generator 210 comprises a switching element sw1, a mirror circuit 214 and a current-to-clock conversion circuit 216. The first terminal of the switching element sw1 is the input terminal of the cell clock generator 210. The control terminal of the switching element sw1 receives a read enable signal ENrd. The second terminal of the switching element sw1 is connected with the current input terminal of the mirror circuit 214. The current output terminal of the mirror circuit 214 is connected with the input terminal of the current-to-clock conversion circuit 216. The output terminal of the current-to-clock conversion circuit 216 generates the cell clock signal CKc.

The input terminal of the reference clock generator 220 receives a reference current Iref. The output terminal of the reference clock generator 220 generates a reference clock signal CKref. The reference clock generator 220 comprises a switching element sw2, a mirror circuit 224 and a current-to-clock conversion circuit 226. The first terminal of the switching element sw2 is the input terminal of the reference clock generator 220. The control terminal of the switching element sw2 receives the read enable signal ENrd. The second terminal of the switching element sw2 is connected with the current input terminal of the mirror circuit 224. The current output terminal of the mirror circuit 224 is connected with the input terminal of the current-to-clock conversion circuit 226. The output terminal of the current-to-clock conversion circuit 226 generates a reference clock signal CKref.

When the read enable signal ENrd is activated, the switching element sw1 and the switching element sw2 are in a closed state.

Meanwhile, the cell clock generator 210 receives a cell current Icell from the selected memory cell 202 and generates the cell clock signal CKc, and the reference clock generator 220 receives the reference current Iref and generates the reference clock signal CKref. Alternatively, the read enable signal ENrd is further converted into an inverted read enable signal (not shown), and the switching elements sw1 and sw2 are operated according to the inverted read enable signal. When the inverted read enable signal is activated, the switching elements sw1 and sw2 are in the closed state.

In an embodiment, the circuitry structure of the cell clock generator 210 and the circuitry structure of the reference clock generator 220 are identical. Moreover, the frequency Fc of the cell clock signal CKc from the cell clock generator 210 is in proportion to the magnitude of the cell current Icell, and the frequency Fref of the reference clock signal CKref from the reference clock generator 220 is in proportion to the magnitude of the reference current Iref. That is, Icell/Iref=Fc/Fref. For example, if the magnitude of the cell current Icell received by the cell clock generator 210 is higher, the frequency Fc of the cell clock signal CKc is higher. Whereas, if the magnitude of the reference current Iref received by the reference clock generator 220 is higher, the frequency Fref of the reference clock signal CKref is higher.

The counter 232 receives the cell clock signal CKc. By counting the pulse number of the cell clock signal CKc, the counter 232 generates a count value CNT.

The latching signal generator 234 receives the reference clock signal CKref and counts the pulse number of the reference clock signal CKref. When the pulse number of the reference clock signal CKref reaches a predetermined count value $CNT_P$, the latching signal generator 234 generates a latching signal LAT.

The data input terminal of the latch 240 receives the count value CNT from the counter 232. The clock terminal of the latch 240 receives the latching signal LAT from the latching signal generator 234. When the latching signal LAT is activated, the received count value CNT is latched as a latched count value CNT L by the latch 240.

The count-to-state conversion circuit 250 receives the latched count value $CNT_L$. Then, the latched count value $CNT_L$ is converted into a state value State by the count-to-state conversion circuit 250. The state value State denotes the storage state of the selected memory cell 202.

Please refer to FIG. 2B. For example, the reference current Iref is 10 µA, and the predetermined count value $CNT_P$ is 10 according to the setting of the latching signal generator 234. That is, when the pulse number of the reference clock signal CKref reaches 10, the latching signal generator 234 activates the latching signal LAT.

At the time point t1, the read enable signal ENrd is activated. Meanwhile, the cell clock generator 210 receives the cell current Icell from the selected memory cell 202 and generates the cell clock signal CKc, and the reference clock generator 220 receives the reference current Iref and generates the reference clock signal CKref to the latching signal generator 234.

At the time point t2, the pulse number of the reference clock signal CKref is 10. Since the predetermined count value $CNT_P$ is 10 according to the setting of the latching signal generator 234, the latching signal LAT is activated. Since the count value CNT generated by the counter 232 is 6 at this moment, the latched count value $CNT_L$ is 6. As mentioned above, Icell/Iref=Fc/Fref. Since Fc=$CNT_L$/(t2−t1) and Fref=$CNT_P$/(t2−t1), it is estimated that the magnitude of the cell current Icell is about 6 µA, i.e., Icell=0.6× Iref=6 µA.

Figures 2C, 3:
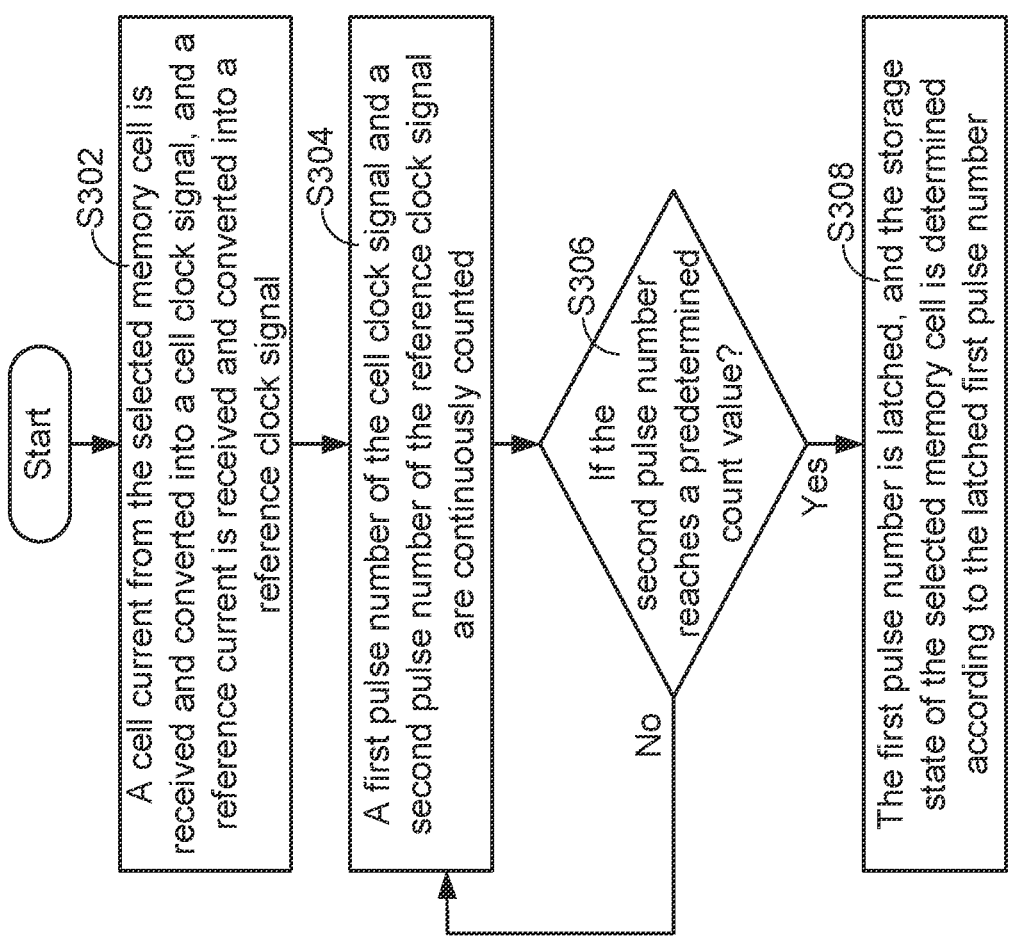
FIG. 2C is a schematic look-up table about the relationships between the cell current, the latched count value and the state value.
FIG. 3 is a flowchart of a sensing method for the sensing circuit according to an embodiment of the present invention.

According to the latched count value $CNT_L$, the count-to-state conversion circuit 250 generates the state value State. The state value State denotes the storage state of the selected memory cell 202. In an embodiment, the function of the count-to-state conversion circuit 250 is implemented through a look-up table. FIG. 2C is a schematic look-up table about the relationships between the cell current, the latched count value and the state value. It is noted that the example of the count-to-state conversion circuit 250 is not restricted. For example, in another embodiment, the function of the count-to-state conversion circuit 250 is implemented through a computation circuit.

In case that the cell current Icell is lower than 2 µA, the latched count value $CNT_L$ outputted from the latch 240 is 0 or 1, and the state value State generated by the count-to-state conversion circuit 250 is "11". In case that the cell current Icell is in the range between 2 µA and 5 µA, the latched count value $CNT_L$ outputted from the latch 240 is 2, 3 or 4, and the state value State generated by the count-to-state conversion circuit 250 is "10". In case that the cell current Icell is in the range between 5 µA and 8 µA, the latched count value $CNT_L$ outputted from the latch 240 is 5, 6 or 7, and the state value State generated by the count-to-state conversion circuit 250 is "01". In case that the cell current Icell is higher 8 µA, the latched count value $CNT_L$ outputted from the latch 240 is larger than 8, and the state value State generated by the count-to-state conversion circuit 250 is "00".

In other words, the count-to-state conversion circuit 250 can estimate the magnitude of the cell current Icell according to the latched count value $CNT_L$ and generates the corresponding state value State. According to the state value State, the storage state of the selected memory cell 202 is determined.

In the above embodiment, the reference current Iref is 10 µA, and the predetermined count value $CNT_P$ is 10. It is noted that the magnitude of the reference current Iref and the predetermined count value $CNT_P$ are not restricted. That is, the magnitude of the reference current Iref and the predetermined count value $CNT_P$ may be varied according to the practical requirements.

In the above embodiment, the sensing circuit 200 is used to sense the multi-level memory cell 202 that is able to store the 2-bit data. It is noted that the applications of the sensing circuit 200 are not restricted. In another embodiment, the sensing circuit 200 can sense the multi-level memory cell 202 that is able to store the 3-bit data. Take the look-up table of FIG. 2C for example, in case that the latched count value $CNT_L$ is 0 or 1, the state value State generated by the count-to-state conversion circuit 250 is "111". In case that the latched count value $CNT_L$ is 2 or 3, the state value State generated by the count-to-state conversion circuit 250 is "110". In case that the latched count value $CNT_L$ is 4 or 5, the state value State generated by the count-to-state conversion circuit 250 is "101". The rest may be deduced by analog. In case that the latched count value CNT L is 14 or 15, the state value State generated by the count-to-state conversion circuit 250 is "000".

Moreover, when the latching signal LAT is activated, the cell clock generator 210 and the reference clock generator 220 are disabled. Since the cell clock generator 210 stops generating the cell clock signal CKc and the reference clock generator 220 stops generating the reference clock signal CKref, the power consumption is reduced.

FIG. 3 is a flowchart of a sensing method for the sensing circuit according to an embodiment of the present invention. After the read action is started, a cell current Icell from the selected memory cell 202 is received and converted into a cell clock signal CKc, and a reference current Iref is received and converted into a reference clock signal CKref (Step S302). That is, the cell clock generator 210 receives the cell current Icell from the selected memory cell 202 and generates the cell clock signal CKc, and the reference clock generator 220 receives the reference current Iref and generates the reference clock signal CKref.

Then, a first pulse number CNT of the cell clock signal CKc and a second pulse number of the reference clock signal CKref are continuously counted (Step S304). That is, the counter 232 starts to count pulse number CNT of the cell clock signal CKc, and the latching signal generator 234 starts to count the pulse number of the reference clock signal CKref.

Then, a step S306 is performed to judge whether the second pulse number reaches a predetermined count value $CNT_P$. If the judging result of step S306 is not satisfied, the step S304 is repeatedly done. Meanwhile, the latching signal LAT is not activated by the latching signal generator 234.

If the judging result of step S306 is satisfied, the first pulse number is latched, and the storage state of the selected memory cell is determined according to the latched first pulse number $CNT_L$ (Step S308). That is, when the latching signal LAT is activated by the latching signal generator 234, the latch 240 generates the latched count value $CNT_L$. Then, the latched count value $CNT_L$ is converted into a state value State by the count-to-state conversion circuit 250. The state value State denotes the storage state of the selected memory cell 202.

Figure 4A:
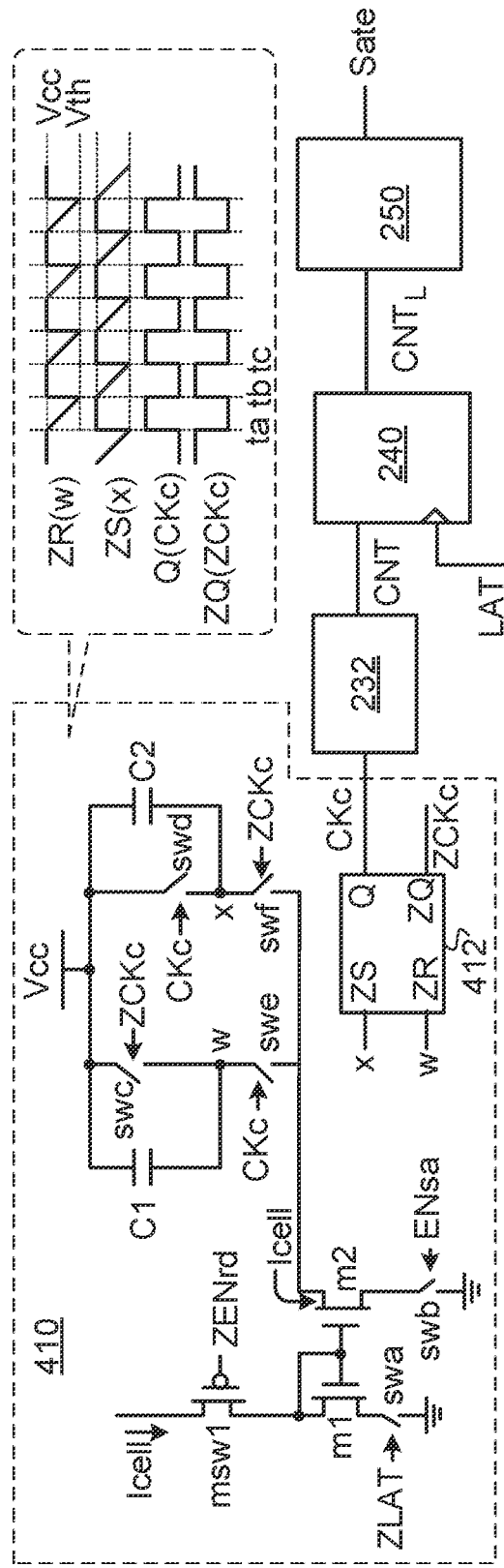
FIG. 4A is a schematic circuit diagram illustrating the detailed circuitry structure of the sensing circuit according to the embodiment of the present invention.
Figure 4A:
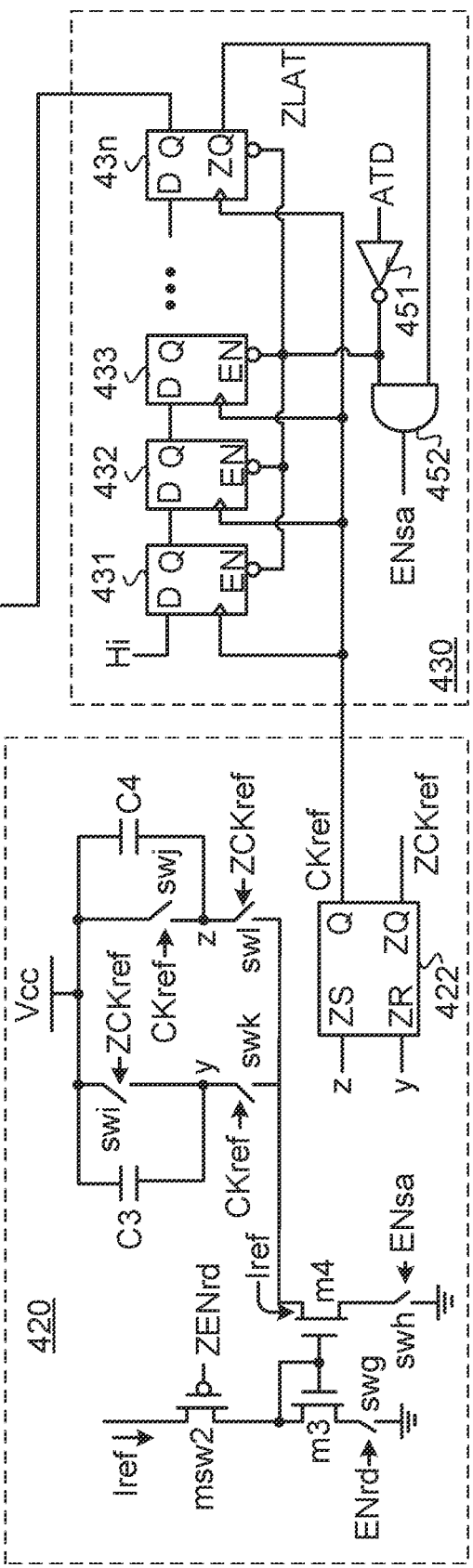

FIG. 4A is a schematic circuit diagram illustrating the detailed circuitry structure of the sensing circuit according to the embodiment of the present invention. The sensing circuit comprises a cell clock generator 410, a reference clock generator 420, a counter 232, a latching signal generator 430, a latch 240 and a count-to-state conversion circuit 250.

The input terminal of the cell clock generator 410 is connected with a selected memory cell (not shown). The output terminal of the cell clock generator 410 generates a cell clock signal CKc. The cell clock generator 410 comprises a switching element, a mirror circuit and a current-to-clock conversion circuit. An example of the current-to-clock conversion circuit is a relaxation oscillator.

The switching element of the cell clock generator 410 comprises a switching transistor msw1. The gate terminal of the switching transistor msw1 receives an inverted read enable signal ZENrd. The first drain/source terminal of the switching transistor msw1 receives a cell current Icell. The second drain/source terminal of the switching transistor msw1 is connected with the current input terminal of the mirror circuit. In another embodiment, the switching element of the cell clock generator 410 comprises a switching transistor msw1 and an NOT gate (not shown). The input terminal of the NOT gate receives a read enable signal ENrd. The output terminal of the NOT gate generates the inverted read enable signal ZENrd to the gate terminal of the switching transistor msw1.

The mirror circuit of the cell clock generator 410 comprises two transistors m1, m2 and two switching elements swa, swb. The gate terminal of the transistor m1 is connected with the first drain/source terminal of the transistor m1. The first drain/source terminal of the transistor m1 is the current input terminal of the mirror circuit. The second drain/source terminal of the transistor m1 is connected with the first terminal of the switching element swa. The second terminal of the switching element swa is connected with a ground terminal. The control terminal of the switching element swa receives an inverted latching signal ZLAT. The gate terminal of transistor m2 is connected with the gate terminal of transistor m1. The first drain/source terminal of transistor m2 is the current output terminal of the mirror circuit. The second drain/source terminal of transistor m2 is connected with the first terminal of switching element swb. The second terminal of the switching element swb is connected with the ground terminal. The control terminal of the switching element swb receives a sense enable signal ENsa.

The relaxation oscillator of the cell clock generator 410 comprises a charge/discharge circuit and a RS flip-flop 412. The charge/discharge circuit comprises capacitors C1, C2 and switching elements swc, swd, swe, sef. Each of the capacitors C1 and C2 has a capacitance value C.

The first terminal of the capacitor C1 receives a supply voltage Vcc. The second terminal of the capacitor C1 is connected with the node w. The first terminal of the switching element swc receives the supply voltage Vcc. The second terminal of the switching element swc is connected with the node w. The control terminal of the switching element swc receives an inverted cell clock signal ZCKc. The first terminal of the switching element swe is connected with the node w. The second terminal of the switching element swe is connected with the current output terminal of the mirror circuit. The control terminal of the switching element swe receives the cell clock signal CKc. The first terminal of the capacitor C2 receives the supply voltage Vcc. The second terminal of the capacitor C2 is connected with the node x. The first terminal of the switching element swd receives the supply voltage Vcc. The second terminal of the switching element swd is connected with the node x. The control terminal of the switching element swd receives the cell clock signal CKc. The first terminal of the switching element swf is connected with the node x. The second terminal of the switching element swf is connected with the current output terminal of the mirror circuit. The control terminal of the switch swf receives the inverted cell clock signal ZCKc.

The inverted set terminal ZS of the RS flip-flop 412 is connected with the node x. The inverted reset terminal ZR of the RS flip-flop 412 is connected with the node w. The output terminal Q of the RS flip-flop 412 generates the cell clock signal CKc. The inverted output terminal ZQ of the RS flip-flop 412 generates the inverted cell clock signal ZCKc.

When the relaxation oscillator is enabled, the switching elements swe and swd are operated according to the cell clock signal CKc, and the switching elements swc and swf are operated according to the inverted cell clock signal ZCKc. In the time interval between the time point ta and the time point tb, the cell clock signal CKc is in the high level state, and the inverted cell clock signal ZCKc is in the low level state. The switching elements swe and swd are in a closed state according to the cell clock signal CKc. The switching elements swc and swf are in an open state according to the inverted cell clock signal ZCKc. Meanwhile, the node x is charged to the supply voltage Vcc, and the node w is discharged from the supply voltage Vcc. Generally, the discharge rate at the node w may be approximately expressed as slope=Icell/C, wherein C is the capacitance value of the capacitor C1. That is, as the magnitude of the cell current Icell is higher, the frequency Fc of the cell clock signal CKc is higher.

At the time point tb, the voltage at the node w is discharged to a threshold voltage Vth, and the RS flip-flop 412 is reset. Meanwhile, the cell clock signal CKc is switched to the low level state, and the inverted cell clock signal ZCKc is switched to the high level state.

In the time interval between the time point tb and the time point tc, the cell clock signal CKc is in the low level state, and the inverted cell clock signal ZCKc is in the high level state. The switching elements swe and swd are in the open state according to the cell clock signal CKc. The switching elements swc and swf are in the close state according to the inverted cell clock signal ZCKc. Meanwhile, the node w is charged to the supply voltage Vcc, and the node x is discharged from the supply voltage Vcc. Similarly, the discharge rate at the node w may be approximately expressed as slope=Icell/C, wherein C is the capacitance value of the capacitor C2.

At the time point tc, the voltage at the node x is discharged to the threshold voltage Vth, and the RS flip-flop 412 is set. Meanwhile, the cell clock signal CKc is switched to the high level state, and the inverted cell clock signal ZCKc is switched to the low level state.

The operations of the relaxation oscillator after the time point tc are similar to those mentioned above, and not redundantly described herein.

The input terminal of the reference clock generator 420 receives a reference current Iref. The output terminal of the reference clock generator 420 generates a reference clock signal CKref. The reference clock generator 420 comprises a switching element msw2, a mirror circuit and a current-to-clock conversion circuit. An example of the current-to-clock conversion circuit is a relaxation oscillator. The mirror circuit comprises two transistors m3, m4 and two switching elements swg, swh. The relaxation oscillator comprises a charge/discharge circuit and a RS flip-flop 422. The charge/discharge circuit comprises capacitors C3, C4 and switching elements swi, swj, swk, swl. Each of the capacitors C3 and C4 has a capacitance value C. The operations of the reference clock generator 420 and the connecting relationships between the components of the reference clock generator 420 are similar to those of the cell clock generator 410. Similarly, as the magnitude of the reference current Iref is higher, the frequency Fref of the cell clock signal CKref is higher.

The latching signal generator 430 comprises n D flip-flops 431~43n, a NOT gate 451 and an AND gate 452. The clock terminals of the n D flip-flops 431~43n receive the cell clock signal CKref. The input terminal of the first D flip-flop 431 receives the high level "Hi". The input terminal D of each of the D flip-flops 432~43n is connected with the output terminal Q of the previous D flip-flop. The output terminal Q of the D flip-flop 43n generates the latching signal LAT. The inverted output terminal ZQ of the D flip-flop 43n generates the inverted latching signal ZLAT. The input terminal of the NOT gate 451 receives a start signal ATD. The output terminal of the NOT gate 451 is connected with the first input terminal of the AND gate 452. The second input terminal of the AND gate 452 receives the inverted latching signal ZLAT. The output terminal of the AND gate 452 generates the sense enable signal ENsa. Moreover, the enable terminals of the n D flip-flops 431~43n are all connected with the output terminal of the NOT gate 451.

As mentioned above, the latching signal generator 430 comprises the n D flip-flops 431~43n, which are connected with each other. After the latching signal generator 430 is enabled and n pulses of the cell clock signal CKref are generated, the last D flip-flop (i.e., the D flip-flop 43n) activates the latching signal LAT. In other words, n is the predetermined count value $CNT_P$ of the latching signal generator 430.

It is noted that numerous modifications and alterations may be made while retaining the teachings of the invention.

For example, in another embodiment, the output terminals of the D flip-flops 431~43n are connected with the n input terminals of a multiplexer. The output terminal of the multiplexer generates the latching signal LAT. That is, the predetermined count value $CNT_P$ is adjusted by the multiplexer.

Figure 4B:
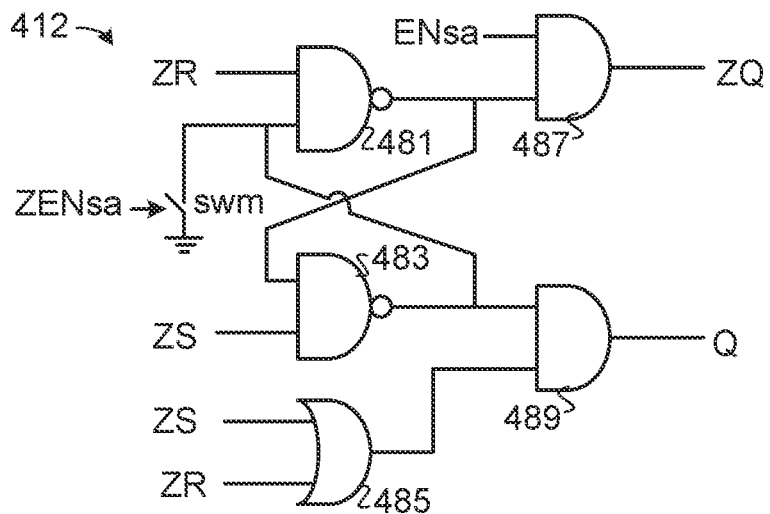
FIG. 4B is a schematic circuit diagram illustrating an example of the RS flip-flop used in the sensing circuit according to the embodiment of the present invention.

FIG. 4B is a schematic circuit diagram illustrating an example of the RS flip-flop used in the sensing circuit according to the embodiment of the present invention. The RS flip-flop 412 comprises a switching element swm, NAND gates 481, 483, an OR gate 485 and AND gates 487, 489. The first input terminal of the NAND gate 481 is connected with the inverted reset terminal ZR of the RS flip-flop 412. The second input terminal of the NAND gate 481 is connected with the output terminal of the NAND gate 483. The first input terminal of the NAND gate 483 is connected with the inverted set terminal ZS of the RS flip-flop 412. The second input terminal of the NAND gate 483 is connected with the output terminal of the NAND gate 481. The first input terminal of the AND gate 487 receives the sense enable signal ENsa. The second input terminal of the AND gate 487 is connected with the output terminal of the NAND gate 481. The output terminal of the AND gate 487 is connected with the inverted output terminal ZQ of the RS flip-flop 412. The two input terminals of the OR gate 485 are respectively connected with the inverted set terminal ZS and the inverted reset terminal ZR of the RS flip-flop 412. The first input terminal of the AND gate 489 is connected with the output terminal of the NAND gate 483. The second input terminal of the AND gate 489 is connected with the output terminal of the OR gate 485. The output terminal of the AND gate 489 is connected with the output terminal Q of the RS flip-flop 412. The switching element swm is connected between the second input terminal of the NAND gate 481 and the ground terminal. The control terminal of the switching element swm receives the inverted sense enable signal ZENsa.

It is noted that the example of the RS flip-flop 412 is not restricted. That is, the RS flip-flop may be composed with other logic gates. For example, in another embodiment, the RS flip-flop comprises the NAND gates 481 and 483 as shown in FIG. 4B only. Under this circumstance, the output terminal of the NAND gate 481 is the inverted output terminal ZQ of the RS flip-flop, and the output terminal of the NAND gate 483 is the output terminal Q of the RS flip-flop.

Figure 4C:
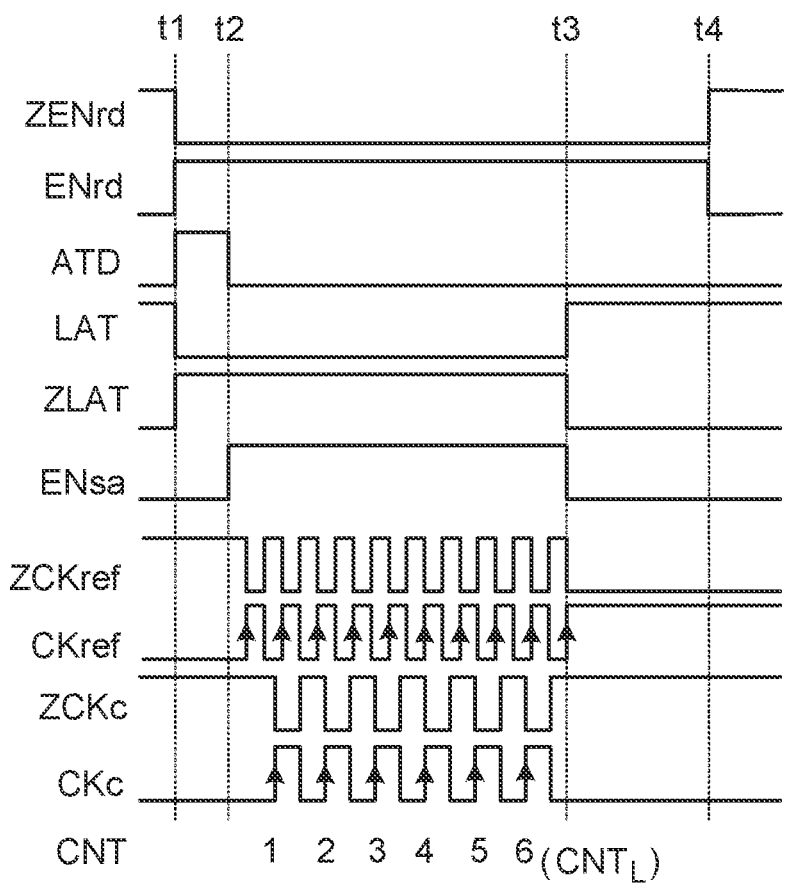
FIG. 4C is a schematic timing waveform diagram illustrating associated signals of the sensing circuit during the read action.

FIG. 4C is a schematic timing waveform diagram illustrating associated signals of the sensing circuit during the read action. For example, the reference current Iref is 10 μA, and the predetermined count value $CNT_P$ of the latching signal generator 430 is 10.

At the time point t1, the read enable signal ENrd is activated. In the cell clock generator 410, the switching transistor msw1 is turned on, and the switching element swa is in the closed state. In the reference clock generator 420, the switching transistor msw2 is turned on, and the switching element swg is in the closed state.

In the time interval between the time point t1 and the time point t2, the start signal ATD generates a pulse. Consequently, the latching signal generator 430 is disabled.

At the time point t2, the sense enable signal ENsa is activated. The switching element swb of the cell clock generator 410 is in the closed state. Consequently, the relaxation oscillator receives the cell current Icell and starts to generate the cell clock signal CKc. Moreover, the switching element swh of the reference clock generator 420 is in the closed state. Consequently, the relaxation oscillator receives the reference current Iref and starts to generate the cell clock signal CKref. Meanwhile, the latching signal generator 430 is enabled. Consequently, the latching signal generator 430 starts to count the pulse number of the cell clock signal CKref.

At the time point t3, the cell clock signal CKref has generated 10 pulses. Meanwhile, the latching signal LAT is activated. Consequently, the received count value CNT is latched as a latched count value $CNT_L$ by the latch 240. That is, the latched count value $CNT_L$ is 6. At the same time, the read enable signal ENrd is inactivated. The switching element swb of the cell clock generator 410 is in the open state. Consequently, the relaxation oscillator stops receiving the cell current Icell, and stops generating the cell clock signal CKc. Moreover, the switching element swh of the reference clock generator 420 is in the open state. Consequently, the relaxation oscillator stops receiving the reference current Iref and stops generating the cell clock signal CKref.

At the time point t4, the read enable signal ENrd is inactivated. Consequently, the read action is ended.

Please refer to FIG. 4A again. The latched count value $CNT_L$ is 6. According to the latched count value $CNT_L$, the count-to-state conversion circuit 250 generates the state value State. The state value State denotes the storage state of the selected memory cell 202. For example, according to the look-up table of FIG. 2C, the state value State "01" indicates that the storage state of the selected memory cell 202 is "01".

From the above descriptions, the present invention provides a sensing circuit and a sensing method for a multi-level memory cell. While the read action is performed, the selected memory cell generates a cell current Icell. According to the cell current Icell, the sensing circuit generates a cell clock signal CKc. In addition, the sensing circuit generates a reference clock signal CKref according to a reference current Iref. In a specified time interval, a first pulse number $CNT_L$ of the cell clock signal CKc and a second pulse number $CNT_P$ of the reference clock signal CKref are counted. Then, the storage state of the selected memory cell is determined according to the relationship between the first pulse number $CNT_L$ and the second pulse number $CNT_P$.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A sensing circuit connected with a selected memory cell, the sensing circuit comprising:
   a cell clock generator receiving a cell current from the selected memory cell, and converting the cell current into a cell clock signal, wherein the selected memory cell is a multi-level memory cell;
   a reference clock generator receiving a reference current, and converting the reference current into a reference clock signal;
   a counter receiving the cell clock signal, and generating a count value;
   a latching signal generator receiving the reference clock signal, wherein when a pulse number of the reference clock signal reaches a predetermined count value, the latching signal generator activates a latching signal;
   a latch receiving the count value and the latching signal, wherein when the latching signal is activated, the latch issues a latched count value; and
   a count-to-state conversion circuit receiving the latched count value, and issuing a state value, wherein a storage state of the selected memory cell is determined according to the state value.

2. The sensing circuit as claimed in claim 1, wherein the cell clock generator comprises:
   a first mirror circuit comprising a current input terminal and a current output terminal;
   a first switching element, wherein a first terminal of the first switching element receives the cell current, a second terminal of the first switching element is connected with the current input terminal of the first mirror circuit, wherein the first switching element is selectively in an open state or a closed state according to a read enable signal; and
   a first current-to-clock conversion circuit connected with the current output terminal of the first mirror circuit, wherein the cell clock signal is outputted from the first current-to-clock conversion circuit,
   wherein when the read enable signal is activated, the first switching element is in the closed state, and the first current-to-clock conversion circuit generates the cell clock signal according to the cell current.

3. The sensing circuit as claimed in claim 2, wherein the first switching element comprises a first transistor, wherein a gate terminal of the first transistor receives an inverted read enable signal, a first drain/source terminal of the first transistor receives the cell current, and a second drain/source terminal of the first transistor is connected with the current input terminal of the first mirror circuit.

4. The sensing circuit as claimed in claim 2, wherein the first mirror circuit comprises a second transistor, a third transistor, a second switching element and a third switching element, wherein a gate terminal of the second transistor is connected with a first drain/source terminal of the second transistor, the first drain/source terminal of the second transistor is the current input terminal of the first mirror circuit, a second drain/source terminal of the second transistor is connected with a first terminal of the second switching element, a second terminal of the second switching element is connected with a ground terminal, a control terminal of the second switching element receives an inverted latching signal, a gate terminal of third transistor is connected with the gate terminal of the second transistor, a first drain/source terminal of third transistor is the current output terminal of the first mirror circuit, a second drain/source terminal of third transistor is connected with a first terminal of the third switching element, a second terminal of the third switching element is connected with the ground terminal, and a control terminal of the third switching element receives a sense enable signal.

5. The sensing circuit as claimed in claim 2, wherein the first current-to-clock conversion circuit is a relaxation oscillator, and the relaxation oscillator comprises a charge/discharge circuit and a RS flip-flop, wherein the charge/discharge circuit is connected with the current output terminal of the first mirror circuit to receive the cell current, a first input terminal and a second input terminal of the RS flip-flop are connected with the charge/discharge circuit, an output terminal of the RS flip-flop generates the cell clock signal, and an inverted output terminal of the RS flip-flop generates an inverted cell clock signal.

6. The sensing circuit as claimed in claim 5, wherein the charge/discharge circuit comprises:

a first capacitor, wherein a first terminal of the first capacitor receives a supply voltage, and a second terminal of the first capacitor is connected with a first node;

a fourth switching element, wherein a first terminal of the fourth switching element receives the supply voltage, a second terminal of the fourth switching element is connected with the first node, and a control terminal of the fourth switching element receives the inverted cell clock signal;

a fifth switching element, wherein a first terminal of the fifth switching element is connected with the first node, a second terminal of the fifth switching element is connected with the current output terminal of the first mirror circuit, and a control terminal of the fifth switching element receives the cell clock signal;

a second capacitor, wherein a first terminal of the second capacitor receives the supply voltage, and a second terminal of the second capacitor is connected with a second node;

a sixth switching element, wherein a first terminal of the sixth switching element receives the supply voltage, a second terminal of the sixth switching element is connected with the second node, and a control terminal of the sixth switching element receives the cell clock signal; and a seventh switching element, wherein a first terminal of the seventh switching element is connected with the second node, a second terminal of the seventh switching element is connected with the current output terminal of the first mirror circuit, and a control terminal of the seventh switching element receives the inverted cell clock signal.

7. The sensing circuit as claimed in claim 6, wherein an inverted reset terminal of the RS flip-flop is connected with the first node, and an inverted set terminal of the RS flip-flop is connected with the second node.

8. The sensing circuit as claimed in claim 7, wherein the RS flip-flop comprises an eighth switching element, a first NAND gate, a second NAND gate, an OR gate, a first AND gate and a second AND gate, wherein a first input terminal of the first NAND gate is connected with the inverted reset terminal of the RS flip-flop, a second input terminal of the first NAND gate is connected with an output terminal of the second NAND gate, a first input terminal of the second NAND gate is connected with the inverted set terminal of the RS flip-flop, a second input terminal of the second NAND gate is connected with an output terminal of the first NAND gate, a first input terminal of the first AND gate receives a sense enable signal, a second input terminal of the first AND gate is connected with the output terminal of the first NAND gate, an output terminal of the first AND gate is connected with the inverted output terminal of the RS flip-flop, two input terminals of the OR gate are respectively connected with the inverted set terminal and the inverted reset terminal of the RS flip-flop, a first input terminal of the second AND gate is connected with the output terminal of the second NAND gate, a second input terminal of the second AND gate is connected with an output terminal of the OR gate, an output terminal of the second AND gate is connected with the output terminal of the RS flip-flop, the eighth switching element is connected between the second input terminal of the first NAND gate and the ground terminal, and a control terminal of the eighth switching element receives an inverted sense enable signal.

9. The sensing circuit as claimed in claim 2, wherein the reference clock generator comprises:

a second mirror circuit comprising a current input terminal and a current output terminal;

a second switching element, wherein a first terminal of the second switching element receives the reference current, a second terminal of the second switching element is connected with the current input terminal of the second mirror circuit, wherein the second switching element is selectively in the open state or the closed state according to the read enable signal; and a second current-to-clock conversion circuit connected with the current output terminal of the second mirror circuit, wherein the reference clock signal is outputted from the second current-to-clock conversion circuit, wherein when the read enable signal is activated, the second switching element is in the closed state, and the second current-to-clock conversion circuit generates the reference clock signal according to the reference current.

10. The sensing circuit as claimed in claim 9, wherein a frequency of the cell clock signal is in proportion to a magnitude of the cell current, and a frequency of the reference clock signal is in proportion to a magnitude of the reference current.

11. The sensing circuit as claimed in claim 1, wherein the latching signal generator comprises n D flip-flops, a NOT gate and a AND gate, wherein clock terminals of the n D flip-flops receive the cell clock signal, an input terminal of a first D flip-flop of the n D flip-flops receives a high level, an input terminal D of each D flip-flop is connected with an output terminal of the previous D flip-flop, an output terminal of the last D flip-flop generates a latching signal, an inverted output terminal of the last D flip-flop generates an inverted latching signal, an input terminal of the NOT gate receives a start signal, an output terminal of the NOT gate is connected with a first input terminal of the AND gate, a second input terminal of the AND gate receives the inverted latching signal, and an output terminal of the AND gate generates a sense enable signal, wherein enable terminals of the n D flip-flops are connected with the output terminal of the NOT gate.

12. The sensing circuit as claimed in claim 1, wherein a function of the count-to-state conversion circuit is implemented through a look-up table.

13. A sensing method for a non-volatile memory, the sensing method comprising steps of:

receiving a cell current from a selected memory cell of the non-volatile memory, and converting the cell current into a cell clock signal, wherein the selected memory cell is a multi-level memory cell;

receiving a reference current, and converting the reference current into a reference clock signal;

continuously counting a first pulse number of the cell clock signal, and continuously counting a second pulse number of the reference clock signal;

latching the first pulse number when the second pulse number reaches a predetermined count value; and determining a storage state of the selected memory cell according to the latched first pulse number.

14. The sensing method as claimed in claim 13, wherein the cell current is received by a first relaxation oscillator, and the cell clock signal is generated by the first relaxation oscillator according to the cell current, wherein the reference current is received by a second relaxation oscillator, and the reference clock signal is generated by the second relaxation oscillator according to the reference current.

15. The sensing circuit as claimed in claim 13, wherein a magnitude of the cell current is obtained according to the predetermined count value, the latched first pulse number and a magnitude of the reference current, wherein the magnitude of the cell current is equal to the magnitude of the reference current multiplied by the first pulse number and divided by the predetermined count value.

* * * * *